(12) United States Patent
Zhang et al.

(10) Patent No.: US 8,272,139 B2
(45) Date of Patent: Sep. 25, 2012

(54) CURVATURE EXAMINING JIG

(75) Inventors: Jia-Chun Zhang, Jiangsu Province (CN); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 89 days.

(21) Appl. No.: 12/957,706

(22) Filed: Dec. 1, 2010

(65) Prior Publication Data

US 2012/0096727 A1    Apr. 26, 2012

(30) Foreign Application Priority Data

Oct. 22, 2010  (TW) .............................. 99136152 A

(51) Int. Cl.
*G01B 5/20* (2006.01)

(52) U.S. Cl. ........................................... 33/552; 33/533

(58) Field of Classification Search .................... 33/552, 33/533, 549, 551, 553, 832, 833, 834, 501.05
See application file for complete search history.

(56) References Cited

U.S. PATENT DOCUMENTS

| | | | | |
|---|---|---|---|---|
| 2,273,954 A * | 2/1942 | Grass | ......................... | 408/115 R |
| 2,492,564 A * | 12/1949 | Gauthier | ...................... | 209/546 |
| 2,835,040 A * | 5/1958 | D'Elia | ............................ | 33/813 |
| 2,977,533 A * | 3/1961 | Savage | ......................... | 324/71.1 |
| 3,214,838 A * | 11/1965 | Skundberg | ................. | 33/501.05 |
| 3,377,713 A * | 4/1968 | Schiler | ............................. | 33/503 |
| 3,862,496 A * | 1/1975 | Rysti et al. | ...................... | 33/124 |
| 4,571,542 A * | 2/1986 | Arai | .............................. | 324/537 |
| 4,592,149 A * | 6/1986 | Long | .............................. | 33/550 |
| 5,218,292 A * | 6/1993 | Goto | ........................ | 324/750.29 |
| 5,231,767 A * | 8/1993 | Brinley | ............................ | 33/533 |
| 6,212,786 B1 * | 4/2001 | Naoi | ............................... | 33/573 |
| 2005/0039342 A1 * | 2/2005 | Kirstine | ......................... | 33/552 |

* cited by examiner

*Primary Examiner* — Chirstopher Fulton
(74) *Attorney, Agent, or Firm* — Schmeiser, Olsen & Watts, LLP

(57) ABSTRACT

A curvature examining jig for examining the curvature of a circuit board quickly and accurately includes a platform and a carrier. An examining region is defined on the platform so as for the circuit board to be disposed flatly within the examining region. A recess is disposed in the examining region and configured to receive a protrusion of the circuit board. The carrier is slidably coupled to the platform, configured to move along the margin of the circuit board, and provided with a plurality of plug gauges facing the platform closely and configured to move to the examining region along with the carrier. Accordingly, the curvature examining jig is convenient in holding a circuit board having a protrusion, quick and accurate in examining the curvature of the circuit board, and effective in enhancing the efficiency of production lines.

8 Claims, 5 Drawing Sheets

CURVATURE EXAMINING JIG

CROSS-REFERENCE TO RELATED APPLICATION

This non-provisional application claims priority under 35 U.S.C. §119(a) on Patent Application No(s). 099136152 filed in Taiwan, R.O.C. on Oct. 22, 2010, the entire contents of which are hereby incorporated by reference.

FIELD OF THE TECHNOLOGY

The present invention relates to curvature examining jigs, and more particularly, to a curvature examining jig for examining the curvature of a circuit board quickly and accurately.

BACKGROUND

Due to the ever-increasing demand for information, plenty of portable electronic products, such as notebook computers, panel computers, and e-book readers, were developed. In addition to their functionality, commercially available electronic products are expected, by electronic product consumers, to be lightweight, compact, and portable. To this end, electronic product manufacturers attach great importance to the flatness of a circuit board inside an electronic product they manufacture. The manufacturing process of a circuit board for use with an electronic product entails welding plenty of electronic components. Thus, during the manufacturing process, the circuit board is often heated up or cooled down by solder, and in consequence the circuit board is deformed, more or less. Sometimes, a circuit board bends greatly or ends up with dislocation of holes/apertures when bent to thereby prevent the circuit board from being installed inside a casing of an electronic product and reduce the yield of the production of the electronic product. As a result, it is necessary to examine the curvature of a circuit board before the circuit board is installed inside the casing of an electronic product, otherwise whatever subsequent operations performed during the manufacturing process will be destined to fail.

Referring to FIG. 1, there is shown a schematic view of examining the curvature of a circuit board 1 according to the prior art. As shown in the drawing, to examine the circuit board 1, an examination worker puts the circuit board 1 on a platform 2 flatly, lifts a plug gauge 3 (0.4 mm thick approximately) manually in a manner that the plug gauge 3 faces the platform 2 closely, and eventually moves the plug gauge 3 along the margin of the platform 2 until the plug gauge 3 is positioned at a corner 11 of the circuit board 1. Possibility of moving the plug gauge 3 from the corner 11 to between the circuit board 1 and the platform 2 indicates that the curvature of the circuit board 1 exceeds the allowable tolerance and thus is unfit for a subsequent assembly operation. Impossibility of moving the plug gauge 3 from the corner 11 to between the circuit board 1 and the platform 2 indicates that the curvature of the circuit board 1, at the corner 11, falls within the allowable tolerance. Afterward, other corners 12, 13, 14 are manually examined by the examination worker with the plug gauge 3. A failure to move the corners 11, 12, 13, 14 to between the circuit board 1 and the platform 2 with the plug gauge 3 indicates that the curvature of the circuit board 1 in its entirety falls within the allowable tolerance and thus does not prevent any subsequent assembly operation from being carried out on the circuit board 1. However, it is time-consuming and laborious to lift the plug gauge 3 manually in order to examine the corners 11, 12, 13, 14 of the circuit board 1 solely for the purpose of examining the curvature of the circuit board 1.

Also, examination is unlikely to be accurate when it is carried out by lifting the plug gauge 3 manually and examining the corners 11, 12, 13, 14 of the circuit board 1, because, in so doing, the examination worker does not always make sure that the plug gauge 3 is facing the platform 2 flatly and closely.

Referring to FIG. 2, there is shown another schematic view of examining the curvature of the circuit board 1 according to the prior art. As shown in the drawing, a conventional process of examining the curvature of the circuit board 1 is inconvenient when a protrusion 17 of a relatively large size is disposed on the circuit board 1 by soldering. Examination of the curvature of the circuit board 1 is inaccurate, because the circuit board 1 lying on the platform 2 is tilted by the protrusion 17. A remedial approach, though an inconvenient one, to improving the accuracy of examination entails putting the circuit board 1 on the platform 2 at a position thereof such that the protrusion 17 soldered to the circuit board 1 is outside of the platform 2 so as to make sure that the circuit board 1 lies flatly on the platform 2. Afterward, the corner 11 of the circuit board 1 is examined with the plug gauge 3. The inconveniency thus incurred repeats whenever the circuit board 1 has to be carefully positioned on the platform 2 in order for the protrusion 17 to lie outside the platform 2 before the commencement of the examination of the corners 12, 13, 14 of the circuit board 1.

Accordingly, it is imperative to provide a jig for examining the curvature of a circuit board quickly and accurately.

SUMMARY

In view of the drawbacks of the prior art, it is an objective of the present invention to provide a curvature examining jig for examining the curvature of a circuit board quickly and accurately.

In order to achieve the above and other objectives, the present invention provides a curvature examining jig for examining the curvature of a circuit board with a protrusion. The curvature examining jig comprises a platform and a carrier. The platform is defined with an examining region so as for the circuit board to lie flatly within the examining region. The examining region has therein a recess for receiving the protrusion. The carrier is slidably coupled to the platform, configured to move along a margin of the circuit board, and provided with a plurality of plug gauges facing the platform closely and movable to the examining region together with the carrier.

Accordingly, the curvature examining jig of the present invention examines the curvature of a circuit board quickly and accurately.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

DETAILED DESCRIPTION

Figure 1:
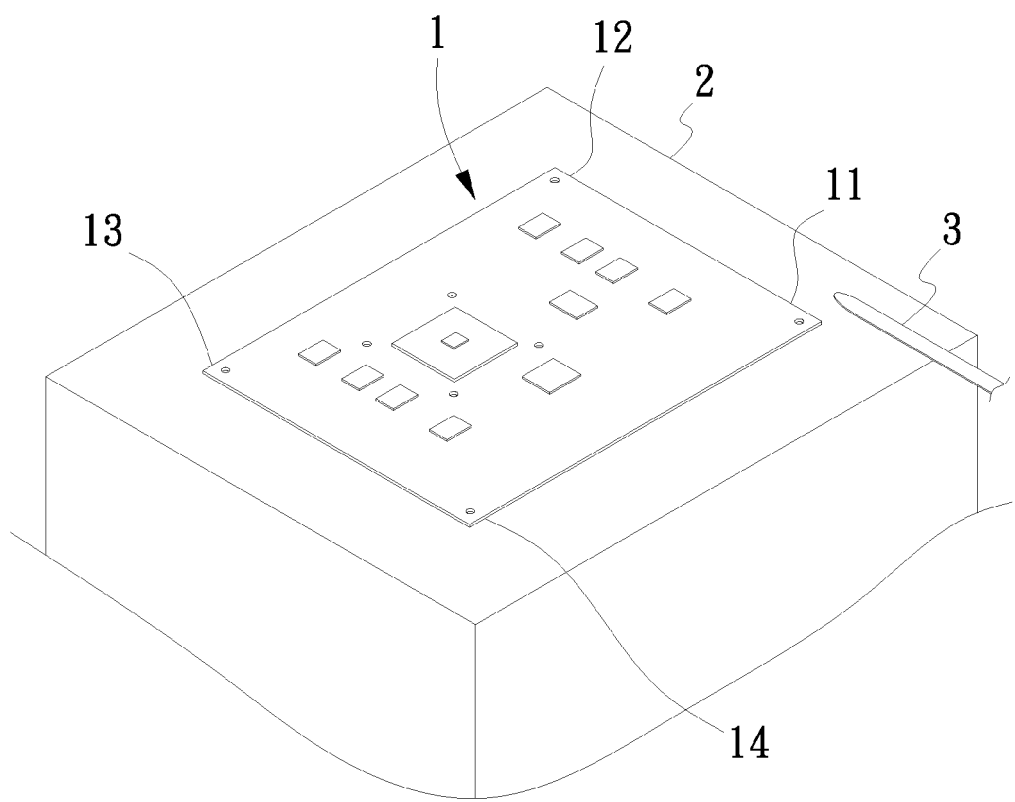
FIG. 1 (PRIOR ART) is a schematic view of examining the curvature of a circuit board according to the prior art.
Figure 2:
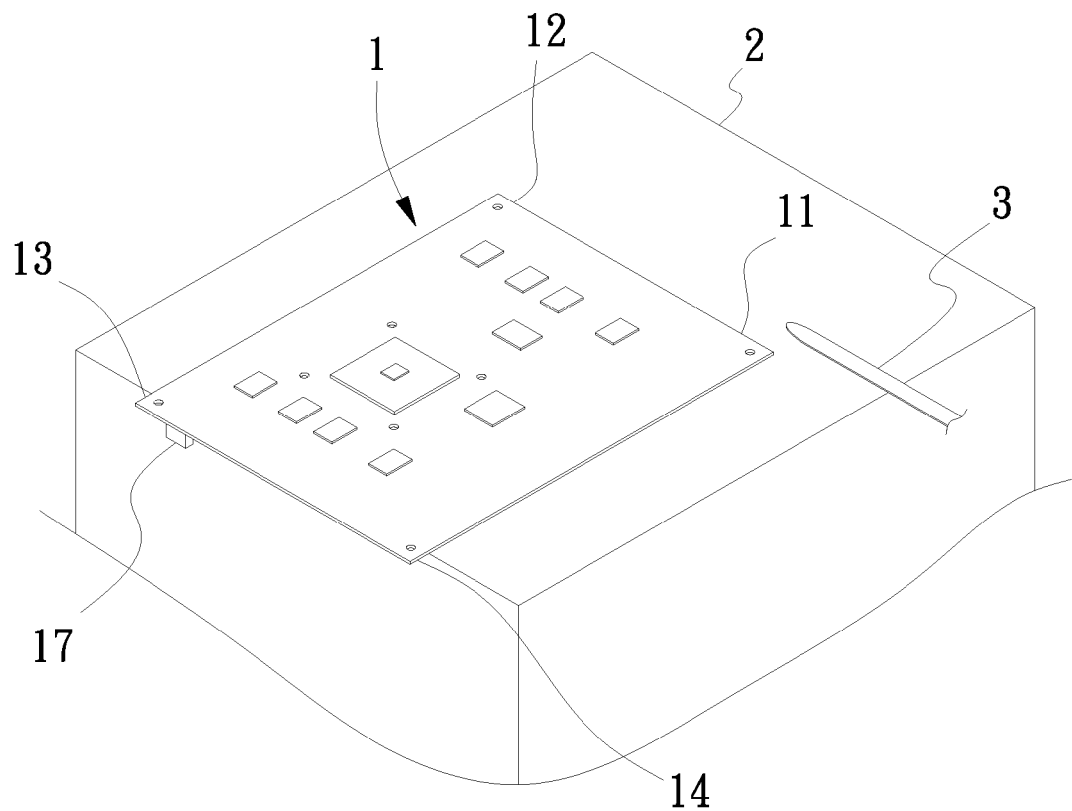
FIG. 2 (PRIOR ART) is another schematic view of examining the curvature of the circuit board according to the prior art.
Figure 3:
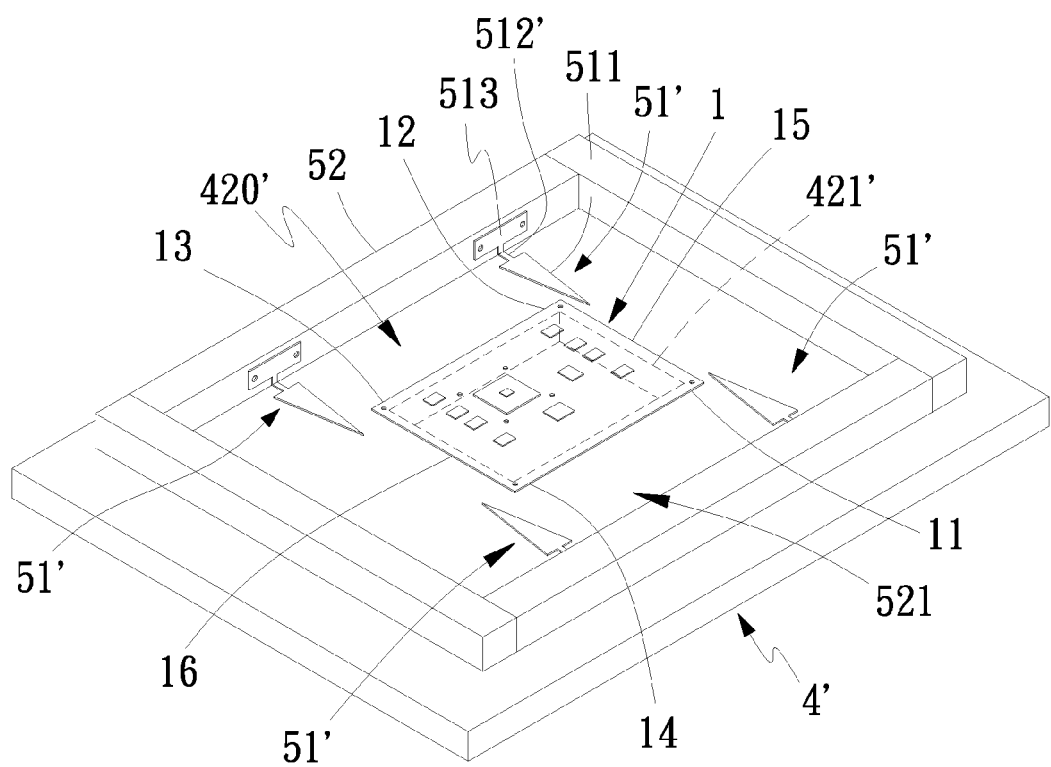
FIG. 3 is a perspective view of a curvature examining jig according to a first preferred embodiment of the present invention.

Referring to FIG. 3, there is shown a perspective view of a curvature examining jig according to a first preferred embodiment of the present invention. As shown in the drawing, the curvature examining jig of the present invention configured to examine the curvature of a circuit board 1 shown in FIG. 1 comprises a platform 4' and a carrier 52. The platform 4' is panel-shaped and defined with an examining region 420' so as for the circuit board 1 to lie flatly within the examining region 420'. The examining region 420' has substantially the same dimensions as the circuit board 1 does. A plurality of protrusions (not shown) protrude from beneath the circuit board 1. Examples of the protrusions are electronic components. A recess 421' for receiving the protrusions of the circuit board 1 is disposed in the examining region 420' of the platform 4'. As a result, the circuit board 1 may lie flatly on the platform 4'. Under its own weight, the circuit board 1 is fixed to the platform 4'. The carrier 52 is slidably coupled to the platform 4', configured to move along the margin of the circuit board 1, and provided with a plurality of plug gauges 51'. The plug gauges 51' face the platform 4' closely and are movable to the examining region 420' together with the carrier 52.

The plug gauges 51' each have a body 511, an L-shaped leaf spring 512', and a fixing plate 513. The L-shaped leaf spring 512' has two ends soldered to the fixing plate 513 and the body 511, respectively. Among others, it is feasible for the body 511, the L-shaped leaf spring 512', and the fixing plate 513 to be integrally formed as a unitary unit, that is, the plug gauge 51'. The fixing plate 513 is engaged with and thus fixed to the carrier 52. The body 511 faces the platform 4' flatly and closely, and is movable to the examining region 420' together with the carrier 52. The body 511 is of a thickness of 0.4 mm approximately. Two of the plug gauges 51' are positioned outside of a margin 15 of the circuit board 1. The other two of the plug gauges 51' are positioned outside of an opposing margin 16 of the circuit board 1. The bodies 511 of the plug gauges 51' are positioned proximate to four corners 11, 12, 13, 14 of the circuit board 1, respectively. The carrier 52 lies flatly on the platform 4' and is movable to and fro across the platform 4'; in other words, the carrier 52 is capable of reciprocation and lateral displacement relative to the platform 4'. Alternatively, it is the platform 4' which is capable of reciprocation and lateral displacement relative to the carrier 52. Each instance of the lateral displacement of the carrier 52 or the platform 4' enables two said plug gauges 51' positioned outside of the margin 15 or the margin 16 of the circuit board 1 to move toward the circuit board 1 laterally. If the bodies 511 are unable to move to between the circuit board 1 and the platform 4', the bodies 511 will be stopped by the circuit board 1 and thus will deviate relative to the fixing plate 513, and in consequence the L-shaped leaf spring 512' will undergo deformation, thereby allowing an examination worker to quickly determine that the curvature of the circuit board 1 falls within the allowable tolerance. If one or two of the bodies 511 are able to move to between the circuit board 1 and the platform 4', the plug gauges 51' will not undergo deformation, thereby allowing the examination worker to quickly determine that the curvature of the circuit board 1 exceeds the allowable tolerance.

Figure 4:
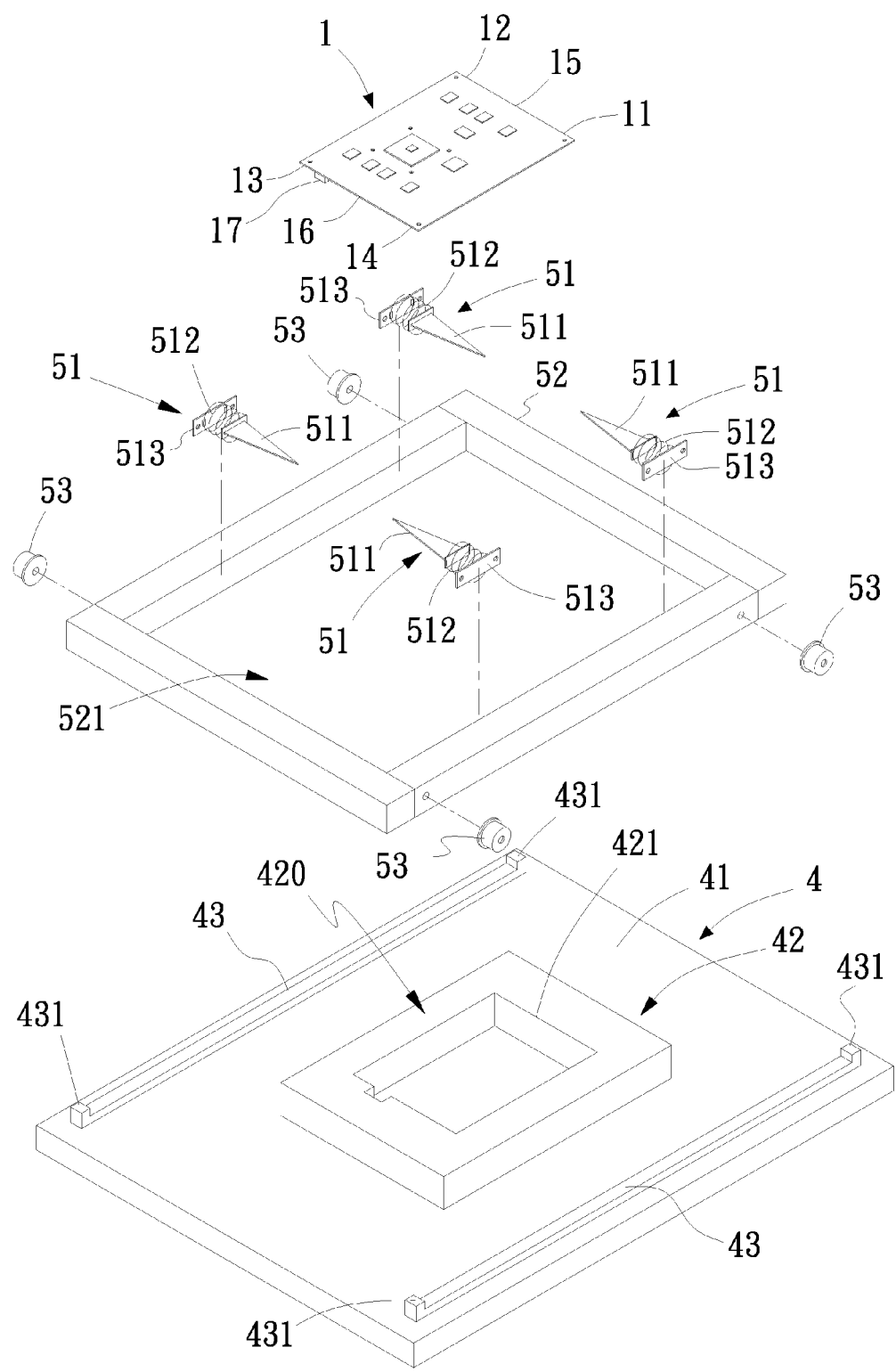
FIG. 4 is an exploded view of the curvature examining jig according to a second preferred embodiment of the present invention.

FIG. 4 is an exploded view of the curvature examining jig according to a second preferred embodiment of the present invention. Referring to FIG. 3 and FIG. 4, in addition to the structure of the plug gauges 51' in the first preferred embodiment, plug gauges 51 in the second preferred embodiment each have the body 511, a connecting spring 512, and the fixing plate 513. The connecting spring 512 has two ends soldered to the fixing plate 513 and the body 511, respectively. The fixing plate 513 is engaged with and thus fixed to carrier 52. The body 511 is of a thickness of 0.4 mm approximately. The body 511 flatly and closely faces the platform 4' of the first preferred embodiment and is movable to the examining region 420' together with the carrier 52.

Figure 5:
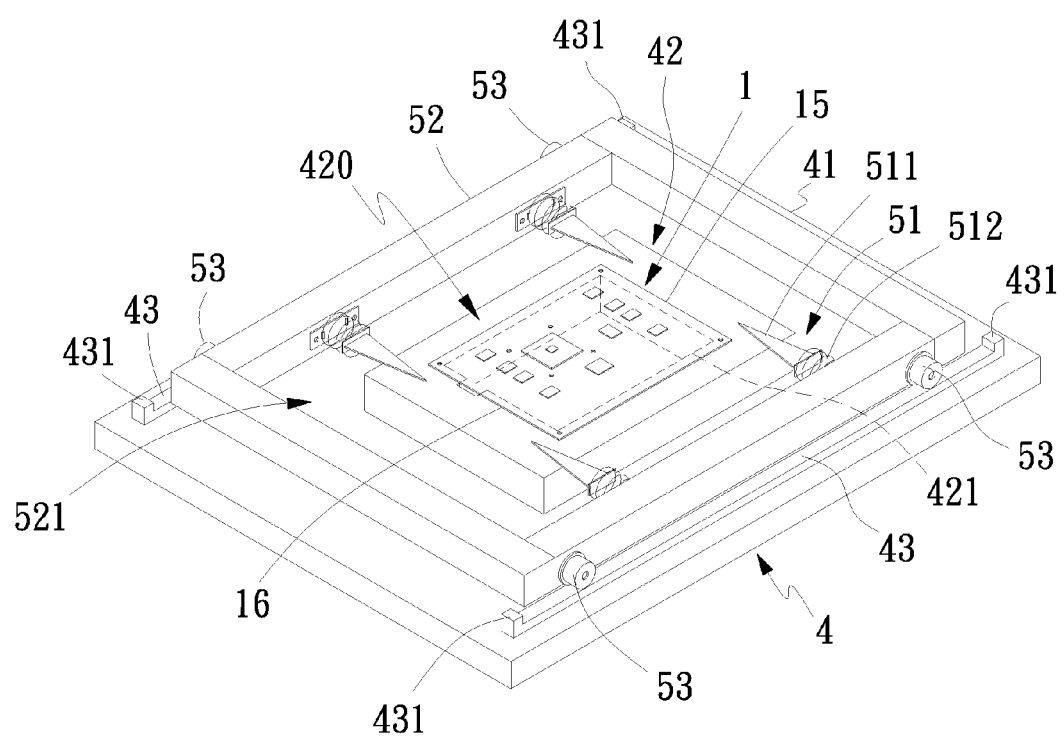
FIG. 5 is a perspective view of the curvature examining jig according to the second preferred embodiment of the present invention when assembled.

The carrier 52 is a rectangular frame defined with a receiving region 521 for receiving the circuit board 1. The plug gauges 51, 51' are each fixed to the wall of the receiving region 521 of the carrier 52. The carrier 52 is made of an antistatic material, such as bakelite. Making the carrier 52 look like a rectangular frame allows the examination worker to scrutinize the inside of the receiving region 521 of the carrier 52 with the naked eye and thereby facilitates the examination work. FIG. 5 is a perspective view of the curvature examining jig according to the second preferred embodiment of the present invention when assembled. Referring to FIG. 4 and FIG. 5, a platform 4 comprises a carrying member 41 and a replacing member 42. The carrying member 41 is made of an antistatic material, such as bakelite. The examining region 420 and a recess 421 are disposed at the replacing member 42 for receiving a protrusion 17, such as an electronic component, beneath the circuit board 1. The replacing member 42 is disposed on the carrying member 41 so as for the circuit board 1 to lie flatly on the replacing member 42. The replacing member 42 and the carrying member 41 are coupled together by "posts and holes", magnets, or mechanical fastener bodies such as Velcro® surfaces or straps. The bodies 511 of the plug gauges 51 face the replacing member 42 flatly and closely. The replacing member 42 is made of a mirror-finished material conducive to reduction in the friction between the replacing member 42 and the bodies 511. The replacing member 42 is replaceable according to the specifications of the circuit board 1, and thus a curvature examining jig of the present invention is capable of examining the circuit board 1 of different specifications.

The recesses 421', 421 each have at least a receiving chamber for receiving all the electronic products beneath the circuit board 1. The margin of the circuit board 1 rests upon the platform 4' or the replacing member 42. In an embodiment of the present invention, the recesses 421', 421 each comprise a plurality of receiving chambers for receiving electronic components beneath the circuit board 1, respectively, whereas the platform 4' or the replacing member 42 underpins the circuit board 1 except for the electronic component thereunder.

A plurality of rails 43 are disposed on the platform 4. The rails 43 are adhered to or fastened to the platform 4, and are positioned outside of the replacing member 42. A plurality of rollers 53 are pivotally coupled to the carrier 52, and are positioned on two outer sides of the carrier 52. The rollers 53 are configured to roll along the rails 43, respectively, so as for the carrier 52 to move along the margin of the circuit board 1 and move to and fro across the platform 4. Alternatively, the platform 4 may move to and fro relative to the carrier 52. In addition, both the rails 43 and the rollers 53 in the second preferred embodiment are also applicable to the first preferred embodiment.

A stopping block 431 is disposed at each of the two ends of each of the rails 43 for stopping a corresponding one of the rollers 53 and thereby limiting the range of movement of the carrier 52. The purpose of the stopping blocks 431 is to prevent the rollers 53 from running off the rails 43 and thus prevent the carrier 52 from being thrown off or damaged. The stopping blocks 431 are each adhered to or fastened to a corresponding one of the rails 43, or are each formed integrally with the corresponding one of the rails 43.

The platforms 4 (the replacing member 42) and the platform 4' are made of a mirror-finished material such that the platforms 4 (the replacing member 42) and the platform 4' have a smooth surface for reducing the friction between each of the bodies 511 and the platform 4 (the replacing member 42) and the platform 4', thereby allowing the bodies 511 to move across the platform 4 (the replacing member 42) and the platform 4' while facing the platform 4 (the replacing member 42) and the platform 4' flatly and closely.

Referring to FIGS. 4 and 5, in the second preferred embodiment of the present invention, it is desirable that the circuit board 1 can lie flatly on the replacing member 42. Under its own weight, the circuit board 1 is fixed to the replacing member 42. The protrusion 17, such as an electronic component, protruding from beneath the circuit board 1 is received in the recess 421 of the replacing member 42 to enable the circuit board 1 to lie flatly on the replacing member 42. Before examining the circuit board 1, the examination worker puts four said plug gauges 51 inside the carrier 52. Two of the plug gauges 51 are disposed outside of the margin 15 of the circuit board 1. The other two of the plug gauges 51 are disposed outside of the opposing margin 16 of the circuit board 1. The bodies 511 of the plug gauges 51 face the replacing member 42 flatly and closely. Before examining the circuit board 1, the examination worker moves the carrier 52 horizontally so as for two said plug gauges 51 positioned outside of the margin 15 of the circuit board 1 to move horizontally toward the corners 11, 12 of the circuit board 1. Movement of either or both of two said bodies 511 to between the circuit board 1 and the replacing member 42 is a sign that the width of the gap between the replacing member 42 and the corner 11 or 12 of the circuit board 1 is larger than 0.4 mm, and thus the examination worker is able to determine quickly that the curvature of the circuit board 1 exceeds the allowable tolerance. A failure to move two other said bodies 511 to between the circuit board 1 and the replacing member 42 (in this failure scenario, two said bodies 511 actually deviate from their expected course) is a sign that the examination worker can swiftly determine that the curvature of the circuit board 1, at the corners 11, 12, falls within the allowable tolerance. Likewise, it is feasible for the examination worker to move carrier 52 horizontally but in the opposite direction so as for two said plug gauges 51 positioned outside of the opposing margin 16 of the circuit board 1 to move horizontally toward the corners 13, 14 of the circuit board 1. Movement of either or both of two said bodies 511 to between the circuit board 1 and the replacing member 42 is a sign that the width of the gap between the replacing member 42 and the corner 13 or 14 of the circuit board 1 is larger than 0.4 mm, and thus the examination worker is able to determine quickly that the curvature of the circuit board 1 exceeds the allowable tolerance. A failure to move two other said bodies 511 to between the circuit board 1 and the replacing member 42 (in this failure scenario, two said bodies 511 actually deviate from their expected course) is a sign that the examination worker can swiftly determine that the curvature of the circuit board 1, at the corners 13, 14, falls within the allowable tolerance, and if the examination worker also determines that the curvature of the circuit board 1, at the corners 11, 12, falls within the allowable tolerance, the examination worker can go further to determine that the curvature of the circuit board 1 in its entirely falls within the allowable tolerance.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit and principles in the disclosure of the present invention should fall within the scope of the present invention as set forth in the appended claims.

What is claimed is:

1. A curvature examining jig for examining a curvature of a circuit board with a protrusion, the curvature examining jig comprising:
    a platform having an examining region so as for the circuit board to lie flatly within the examining region, the examining region having therein a recess for receiving the protrusion; and
    a carrier slidably coupled to the platform, the carrier configured to move along a margin of the circuit board, and provided with a plurality of plug gauges facing the platform closely and movable to the examining region together with the carrier;
    wherein, when the plurality of plug gauges are unable to move to between the circuit board and the platform, the curvature of the circuit board falls within an allowable tolerance;
    wherein, when one of the plurality of plug gauges is able to move to between the circuit board and the platform, the curvature of the circuit board exceeds the allowable tolerance.

2. The curvature examining jig of claim 1, wherein the plurality of plug gauges each have: a body facing the platform closely and movable to the examining region together with the carrier; an L-shaped leaf spring having an end connected to the body; and a fixing plate connected to another end of the L-shaped leaf spring and fixed to the carrier.

3. The curvature examining jig of claim 1, wherein the plurality of plug gauges each have: a connecting spring; a body connected to an end of the connecting spring, configured to face the platform closely, and movable to the examining region together with the carrier; and a fixing plate connected to another end of the connecting spring and fixed to the carrier.

4. The curvature examining jig of claim 1, wherein the carrier is a rectangular frame defined with a receiving region for receiving the circuit board, and the plurality of plug gauges are fixed to a wall of the receiving region of the carrier.

5. The curvature examining jig of claim 1, wherein the platform further comprises a carrying member and a replacing member disposed on the carrying member, wherein the examining region and the recess are disposed at the replacing member.

6. The curvature examining jig of claim 1, wherein the platform is further provided with a plurality of rails, and the carrier is further provided with a plurality of rollers, such that the plurality of rollers and the plurality of rails together enable the carrier to move along a margin of the circuit board.

7. The curvature examining jig of claim 6, wherein a stopping block is disposed at each of two ends of each of the plurality of rails for limiting a range of movement of the carrier.

8. The curvature examining jig of claim 1, wherein the platform is partially made of a mirror-finished material such that the platform has a smooth surface.

* * * * *